(12) United States Patent
Swanson et al.

(10) Patent No.: US 7,325,164 B2
(45) Date of Patent: *Jan. 29, 2008

(54) SYSTEM AND METHOD FOR MULTIPLE CYCLE CAPTURE OF CHIP STATE

(75) Inventors: Jeffrey C. Swanson, Sunnyvale, CA (US); Sharon M. Ebner, Mountain View, CA (US); John A. Wickeraad, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 389 days.

This patent is subject to a terminal disclaimer.

(21) Appl. No.: 10/670,620

(22) Filed: Sep. 25, 2003

(65) Prior Publication Data

US 2004/0153838 A1 Aug. 5, 2004

(51) Int. Cl.
*G06F 11/00* (2006.01)
(52) U.S. Cl. .......................................... 714/30; 714/31
(58) Field of Classification Search .................. 714/30, 714/31
See application file for complete search history.

(56) References Cited

U.S. PATENT DOCUMENTS

| | | | |
|---|---|---|---|
| 4,567,590 A | 1/1986 | Bederman | |
| 5,067,130 A | 11/1991 | Jackson | |
| 5,450,349 A | 9/1995 | Brown, III et al. | |
| 5,657,253 A | 8/1997 | Dreyer et al. | |
| 5,751,735 A | 5/1998 | Tobin et al. | |
| 5,771,240 A | 6/1998 | Tobin et al. | |
| 5,867,644 A | 2/1999 | Ranson et al. | |
| 5,951,696 A | 9/1999 | Naaseh et al. | |
| 6,003,107 A | 12/1999 | Ranson et al. | |
| 6,334,198 B1 | 12/2001 | Adusumilli et al. | |

OTHER PUBLICATIONS

European Search Report issued for EP 01 10 6602, dated Jun. 14, 2004.
Coffman, et al., "Processor-Ring Communication: A Tight Asymptotic Bound on Packet Waiting Times," Jul. 13, 1999.

*Primary Examiner*—Michael C Maskulinski
(74) *Attorney, Agent, or Firm*—Fulbright & Jaworski LLC

(57) ABSTRACT

Test circuitry is incorporated on a chip die together with a circuit to be tested, such as an ASIC or microprocessor, to provide external access to signals that are internal to an integrated circuit chip package. A controller provides the arm command and issues appropriate configuration controls to collect signal samples. In particular, a network responds to these commands from the controller to selectively provide signal samples from a device under test. A trigger event generator responds to logic or other characteristics of the signal samples to provide trigger events. These trigger events are counted by a trigger event counter in the armed state of the state machine to identify the final trigger event corresponding to an occurrence of a programmable number of the trigger events. A store event generator also responds to a programmed characteristic or combination(s) of the signal samples to provide a store event. Either or both of the event generators may use a mask to provide these events.

3 Claims, 11 Drawing Sheets

SYSTEM AND METHOD FOR MULTIPLE CYCLE CAPTURE OF CHIP STATE

TECHNICAL FIELD

This invention relates generally to very large scale integration (VLSI) testing, and more particulary to a system and method for on-chip debug support and performance monitoring for microprocessors and microprocessor systems.

BACKGROUND

It has become very difficult to diagnose failures in and to measure the performance of state-of-the-art very large scale integration (VLSI) chips. This is because modern VLSI chips often not only run at very high clock speeds, but many of them also execute instructions in parallel, out of program order and speculatively. Moreover, visibility of the VLSI chip's inner state has become increasingly limited due to the complexity of the VLSI chips and to practical constraints on the number of external pads that can be provided on the chip package.

In the past, the traditional failure diagnosis and performance measurement tools have been external logic analyzers and in-circuit emulators. Logic analyzers are capable of monitoring signals on the chip pads and other externally-accessible system signals, capturing the state of these signals and generating triggers based on their states. Unfortunately, logic analyzers must rely solely on externally-accessible signals to accomplish this, not on signals that are internal to the chip itself. In-circuit emulators, on the other hand, are used to mimic the functional characteristics of a new VLSI chip in a system environment and to add visibility to certain data values within the VLSI chip. But such devices only emulate the functionality of the VLSI chip. By their very nature, they cannot give an accurate representation of the performance characteristics of an actual silicon device. Therefore, they are primarily useful only for developing and debugging system software.

Thus, as an alternative or supplement to system emulation, confirmation of operation of an integrated circuit, such as a microprocessor, application specific integrated circuit (ASIC) or similar device, is accomplished using the actual, fabricated device, i.e., the device as produced in "silicon." By applying test signals to the actual device and monitoring its operation, a developer or manufacturer can confirm both logic and electrical functions. Likewise, any problems identified must be debugged and remedied. Visibility inside a chip therefore becomes of paramount importance to address, debug, and correct functional, logical and/or electrical problems.

A certain level of visibility within the chip is provided by external interfaces of the chip. External interfaces can come in several different types. Debug information can be fed out of the chip on the bus interface on unused cycles, or in unused fields on a given cycle. Additionally, prior solutions have provided dedicated pins on the chip to act as a debug port to give visibility into the chip. The pin can be directly attached to a point within the chip for a reading or the pin can provide the ability to mux out important internal information on the dedicated pin. When internal chip information is accessed from either the bus interface or dedicated pin, a logic analyzer or other monitoring device is required to access the information. The use of a logic analyzer or other monitoring device brings with it several disadvantages. First, extra pins dedicated to debug functionality are required in the chip package. These extra pins increase overall costs, and the use of these pins for debug functionality compete with chip functionality resulting in less functionality included within the chip. Secondly, designing and verifying the software to be used with the logic analyzer or other monitoring device to read and interpret the information obtained from the chip is very costly. Finally, attaching the logic analyzer or other monitoring device to the chip to acquire the information competes directly with the proper placement of the chip within the computer system. These difficulties result in longer chip debug schedules.

The number of pins dedicated to debug operations may be reduced by allowing the logic analyzer or other monitoring device to inform the chip as to what debug information is of interest. This can be accomplished by providing elaborate trigger mechanisms to reside within the chip which collapse down to a single trigger out signal to the external logic analyzer. In addition to reducing the number of dedicated pins to debug operations this solution may also provide an earlier insight into the chip logic by allowing the logic analyzer to inform the chip of the area of interest. While this solution does reduce the number of pins dedicated to debug operations, several debug port pins are still required in the design and verification of the logic analyzer software is still costly. Additionally, the trigger solution limits the internal trigger to a specific set of internal source nodes of those that have been predefined and implemented.

Another method of providing information for debugging operations consists of the use of shadow registers. Shadow registers allow an internal trigger or an external trigger fed into the chip to permit the capture of a limited set of information into the shadow registers. The information contained within the shadow registers then can be accessed through the IEEE 1149.1 port (or other scanport or software port) without impacting the normal operations of the chip. Shadow registers are implemented within the chip with the addition of shadow flops. The location of the shadow flops must be predetermined during the chip design phase. Area constraints limit the number of shadow flops that can be placed in the design and the shadow flops tend to be expensive. So debug operations through the use of shadow registers is limited by the number of shadow flops that can be included in the design and by the difficulty in selecting the most likely places for the shadow flops to be required to provide visibility into the functionality of the chip. This problem is further exasperated if multiple cycles of information are required for a node or a bus in order to perform debug operations. The storing of data from multiple registers would require additional flops to be included in the circuit design. However, if a problem were repeatable, multiple cycles of information could be obtained from the chip by successive iterations in which debug information for sequential cycles is obtained. Data obtained in this manner can be interpreted as a virtual logic analyzer trace of the shadow flop locations. While all shadow flops within the chip can be viewed in this manner, if the problem being debugged is not repeatable this process cannot be used.

Alternatively, a trigger can be used to halt the clock of the chip and thereby "freeze" all of the information within the chip components. Now all the flops on the normal internal scan chain can be scanned out and the debug information acquired in this manner. Typically a large number of scan-able flops are included in the chip design and this inclusion results in only a small increase in the area required. However, in order to perform debug operations in this manner, the clock must be repeatedly halted which interrupts normal operation of the chip during the debug operation. Additionally, repeatability of the system is still required to debug problems which involve multiple cycles of information.

Prior methods and devices have attempted to address testing of very large scale integrated (VLSI) circuits by incorporating testing circuitry into the chip. For example, the IEEE 1149.1 standard specifies a four or five wire serial test bus requiring one pin each for test data in, test data out, test mode select, a test pulse or clock signal and an optional test reset. Because it is serial, this interface is typically limited to providing one bit of test data out for every clock cycle of the unit under test. Thus, capture of test information is limited.

Another system is described in U.S. Pat. No. 5,867,644, issued Feb. 2, 1999, to Ranson, et al., incorporated herein in its entirety by reference, and discloses a user-configurable diagnostic hardware contained on-chip with a microprocessor for debugging and monitoring the performance of the microprocessor. A programmable state machine is coupled to on-chip and off-chip input sources. The state machine may be programmed to took for signal patterns presented by the input sources, and to respond to the occurrence of a defined pattern (or sequence of defined patterns) by driving certain control information onto a state machine output bus. On-chip devices coupled to the output bus take user-definable actions as dictated by the bus. The input sources include user-configurable comparators located within the functional blocks of the microprocessor. The comparators are coupled to storage elements within the microprocessor, and are configured to monitor nodes to determine whether the state of the nodes matches the data contained in the storage elements. By changing data in the storage elements, the programmer may change the information against which the state of the nodes is compared and also the method by which the comparison is made. The output devices include counters having outputs that may be used as state machine inputs, so one event may be defined as a function of a different event having occurred a certain number of times. The output devices also include circuitry for generating internal and external triggers. User-configurable multiplexer circuitry may be used to route user-selectable signals from within the microprocessor to the chip's output pads, and to select various internal signals to be used as state machine inputs.

Another solution to chip testing is presented in U.S. Pat. No. 6,003,107, issued Dec. 14, 1999, to Ranson, et al and incorporated herein in its entirety by reference. This patent describes circuitry for providing external access to signals that are internal to an integrated circuit chip package. The circuitry includes a N:1 multiplexers distributed throughout the integrated circuit die. Each of the multiplexers has its N inputs coupled to a nearby set of N nodes within the integrated circuit, and each of the multiplexers is coupled to a source of select information operable to select one node from the set of N nodes for external access. The multiplexers outputs are coupled to an externally-accessible chip pad. The integrated circuit is typically a microprocessor, and the source of select information may include a storage element of the microprocessor. If so, additional circuitry may be provided for writing data from a register of the microprocessor to the storage element using one or more microprocessor instructions. Each multiplexer may be coupled to a different source of select information, or all multiplexers may be coupled to the same select information. A fixed set of interconnect traces may be provided to couple a fixed set of nodes to an additional set of externally-accessible chip pads. One or more M:1 multiplexers may also be provided, having their M inputs coupled to M different outputs of the N:1 multiplexers. Each of the M:1 multiplexers may be coupled to a second source of select information. Preferably, the outputs of the M:1 multiplexers will be coupled to a circuitry for facilitating debug and performance monitoring of the integrated circuit.

However, these systems require some compromise between on-chip storage capabilities, pins available for providing signal and data samples, and multiplexing required to provide plural outputs on each available pin. For example, a large on-chip storage capability means additional chip area dedicated to functions that may not be used or even made available after debugging and circuit operation is verified. Even when chip area can be spared, the stored test results must be accessed by providing some combination of pins and clock cycles to multiplex the results out onto the pins. As the number of pins available is often substantially less than the number of parameters, signals, and data bits to be provided, the onboard test memory must act as a buffer. However, as the circuit under test continues to operate and test results are generated more quickly than the pin count will permit providing thereof, the memory will rapidly continue to fill until, eventually, an overflow condition will be reached, data lost, and circuit operation compromised.

Accordingly, a need exists for a way to collect test and debug data from an integrated circuit without requiring an inordinate number of test output pins or on-chip test memory size.

SUMMARY OF THE INVENTION

According to an aspect of the invention, external access is provided to signals that are internal to an integrated circuit chip package. Test circuitry includes a distributed data sampling network having multiplexers physically distributed throughout the integrated circuit die. Each of the multiplexers has some or all of its inputs coupled to nearby sets of nodes within the integrated circuit. An event trigger generator receives a first N bits of sampled data from the network and, using a programmable mask, selectively performs one or more boolean operations on the sampled data to provide an event trigger. The event trigger may further include a switch for selectively providing, as the event trigger, (i) a result of the boolean operation on the sampled data, (ii) a performance counter event signal, or (iii) an externally applied trigger signal.

The test circuitry may further include a counter providing an intermediate trigger in response to a predetermined number of the event triggers. A trigger delay may provide a sample command a predetermined number of cycles following the intermediate trigger. The cycles may be operating, clock, processor, or other cycles of or used by the integrated circuit under test of the test circuit itself.

The test circuitry may further include a programmable register storing a value corresponding to the predetermined number of cycles. The programmable register selectively increments the value corresponding to the predetermined number of cycles by a predetermined number of the cycles. This feature allows for capturing successive sequences of test data over multiple test runs.

The test circuitry may further include a trigger delay providing a sample command a predetermined number of cycles following the event trigger. A memory, such as a FIFO, may be used to receive and store the data wherein new data is stored in favor of automatically discarded oldest data. Output circuitry may be used to provide portions of the samples, combining the samples to form composite sample groups spanning multiple sampling periods. A counter or clock output may form part of each group to indicate relative or clock time at which the sample was obtained.

According to a feature of the invention, a trigger event counter is configured to provide an intermediate trigger in response to a programmable number of a first type of the event triggers. A similarly configured store event counter initiates a storage of data samples over a programable number of sequential cycles in response to a second type of the event triggers. A post trigger counter may initiate processing of the data samples in response to storage of a programmable number of the data samples. A FIFO type memory may be used to store the data samples. A pretrigger store event responds to an armed command for initiating a storage of the data samples during a period beginning prior to, and ending in response to, the first type of trigger.

According to another aspect of the invention, a test device includes a state machine responsive to (i) an arm command for transitioning from a standby state to an armed state, (ii) a final trigger event for transitioning from the armed state to a triggered state, and (iii) a post trigger count event for transitioning from the triggered state to the standby state. A controller provides the arm command and issues appropriate configuration controls to collect signal samples. In particular, a network responds to these commands from the controller to selectively provide signal samples from a device under test. An event trigger generator responds to logic or other characteristics of the signal samples to provide an event trigger. These event triggers are counted by an event trigger counter in the armed state of the state machine to identify the final trigger event corresponding to an occurrence of a programmable number of the event triggers. A store trigger generator also responds to a programmed characteristic or combination(s) of the signal samples to provide a store trigger. Either or both of the trigger generators may use a mask to provide these triggers. A post trigger sample counter operable in the triggered state to provide the post trigger count event in response to a programmable number of signal samples being captured. A memory operates in the triggered state to store the samples being captured. The memory may be additionally operable in the armed state to store samples occurring prior to the targeted samples so as to provide test data from cycles prior to the targeted events.

According to another aspect of the invention, a method provides external access to signals that are internal to an integrated circuit chip package. The method includes a step of receiving a plurality of N bit wide signals at locations distributed throughout the integrated circuit die. One of the signals is selected and masked to provide event triggers. An intermediate trigger is generated once a predetermined (programmable) number of the triggers are detected. This intermediate trigger may be delayed a number of cycles prior to initiation of test data capture.

According to another aspect of the invention, a method includes defining a plurality of states including (i) standby, (ii) armed, and (iii) triggered. Transition steps define state changes including:

transitioning from the standby state to the armed state in response to an arm trigger;

transitioning from the armed state to the triggered state in response to final trigger event; and transitioning from the triggered state to the standby state in response to post trigger count event.

Signal samples are selectively provided (e.g., collected from multiple points and multiplexed down) from a device under test. The signal samples are subject to programmable boolean operations to provide the event triggers and the store triggers. In the armed state, a programmable number of the event triggers may be counted to provide the final trigger event thereby causing the state machine to transition to the triggered state. A programmed number of the signal samples are stored in response to each store event. Store events may be generated during both the armed and the trigger states to provide for the collection of data immediately prior to the trigger state. Using a FIFO memory, excessive amounts of data stored prior to the final event trigger are lost in preference to storage of later data. A pseudo clock value may be inserted into a portion of the FIFO memory to provide a relative time stamp for the associated data stored in the FIFO. A step of counting a programmable number of signal samples in the triggered state results in provision of the post trigger count event, terminating data sampling and possibly initiating output or other processing of the collected data samples.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION

A preferred embodiment of the invention includes three main components: (1) a debug bus circuit on-chip; (2) flexible trigger/store network; and (3) an on-chip (or off-chip) storage array/FIFO. Each of these components is useful and functional independent of the others but provide additional advantages when combined as here in detail.

Figure 1:
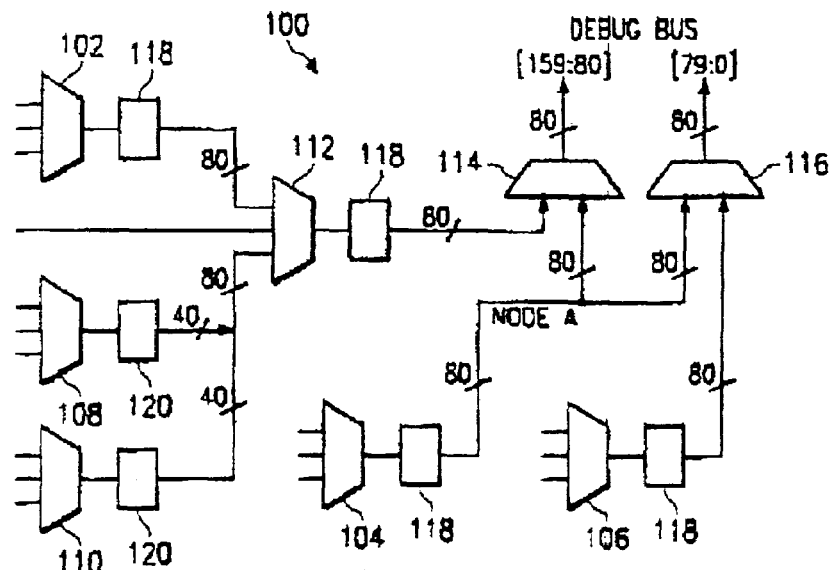
FIG. 1 is a schematic diagram of a plurality of multiplexers connected to selectively provide data samples from the various parts of a integrated circuit.

Referring to FIG. 1, an embodiment of the debug bus circuit 100 includes a plurality of multiplexers connected to various sampling points on a chip. The multiplexers may handle various data sample widths. For example, multiplexers 102, 104 and 106 each sample a plurality of 80 bit wide data and/or control signals while multiplexers 108 and 110 each sample up to 40 bits each. While each of the samples may represent a single unit of data such as a data word, the samples may also include various combinations of smaller data units and/or discrete signals collected to provide respective parallel outputs. These outputs may, in turn, combine to provide a desired 160 bit wide output to a debug bus. Thus, respective 40 bit outputs from multiplexers 108 and 110 are provided to data latches 120 and combined into a single 80 bit wide output provided to multiplexer 112. Multiplexer 112 also receives input from multiplexer 102 via latching circuit 118 and from multiplexer 110. Similarly, an 80 bit wide output from multiplexer 106 is provided via latching circuit 118 as an input to multiplexer 116 as is a data sample provided by multiplexer 104 via latching circuit 118. In addition, the 80 bit wide output from multiplexer 104 is also provided to multiplexer 114.

According to this arrangement, the output from multiplexer 104 can be provided either as the lower 80 bits [79:0] or upper 80 bits [159:80] of the 160 bit wide sample provided to the data bus.

It should be noted that, although multiplexers 102-110, as shown, each have three selectable inputs for clarity of illustration, a practical implementation of the invention might include hundreds of multiplexers located about a chip for sampling hundreds or thousands of data points and signals. Further, each of the multiplexers may have fewer or greater numbers of inputs and of various data widths so as to provide appropriate data control and other logic signal samples.

This distributed multiplexing scheme has the advantage that thousands of source points can be selected while providing for a reasonable distribution of routing congestion about a chip. Additional stages and levels of multiplexers may be chained together with appropriate register pipe stages (data latches) to accommodate timing requirements. While the addition of pipe stages may result in delay of a final debug bus output, this disadvantage is relatively minor to the extent that all sources travel through equal number of pipe stages and thereby reflect the relative timing of the chip. Thus, it may be necessary to add delays in the form of data latches to ensure that data samples taken during a given cycle are available for output during a common subsequent cycle.

Figure 2:
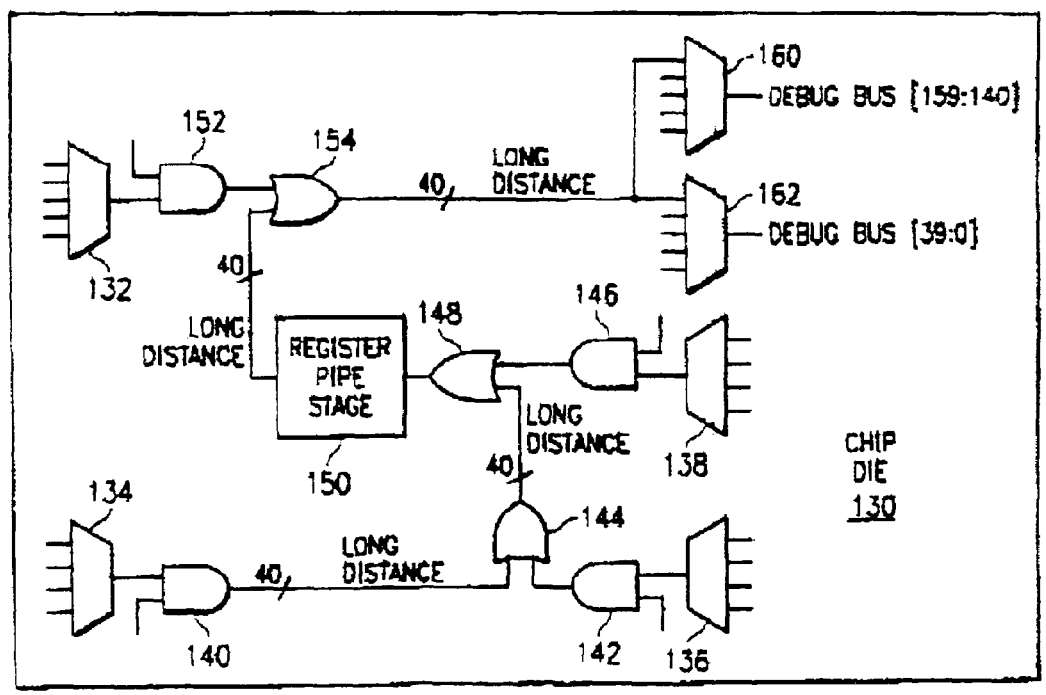
FIG. 2 is a block diagram of a distributed multiplexing arrangement locating multiplexers adjacent data sample points and providing all or a portion of the sample data in selected portions of an output sample.

A schematic layout of a distributed multiplexing scheme is depicted in FIG. 2 in which multiplexers and support logic for capturing data at various points on a chip die 130 are distributed to collect and select data near points on the chip die at which the data is available. Thus, multiplexers 132, 134 and 136 are located on chip die 130 proximate respective data sampling points to be selectably provided to the debug bus. Each of the multiplexers supplies an output via a respective AND gate 140, 142, 146 and 152 for selecting an output of the respective gate and enabling a transmission thereof to an associated OR gate 144, 148 and 154 combining pairs of multiplexer outputs. Note that, register pipe stage 150 is provided at an output of OR gate 148 to accommodate propagation delays and other timing variations and offsets caused by transmission distances and propagation delays along the chip die. Thus, as shown in FIG. 2, up to 40 bits of data sampling may be selected by each of the multiplexers 132-138, each having its output selectably provided via an associated AND gate to an OR gate combining pairs of multiplexer outputs. Thus, one of the outputs of the multiplexers is provided to a final stage of multiplexing provided by multiplexers 160 and 162. Multiplexer 160 provides a preselected portion of the 40 bits, e.g., the least significant 20 bits, as bit positions 140-159 to the debug bus. Alternatively, all 40 bits are provided to multiplexer 162 which selectively provides the full data sample to bit positions 0-39 of the debug bus.

Figure 3:
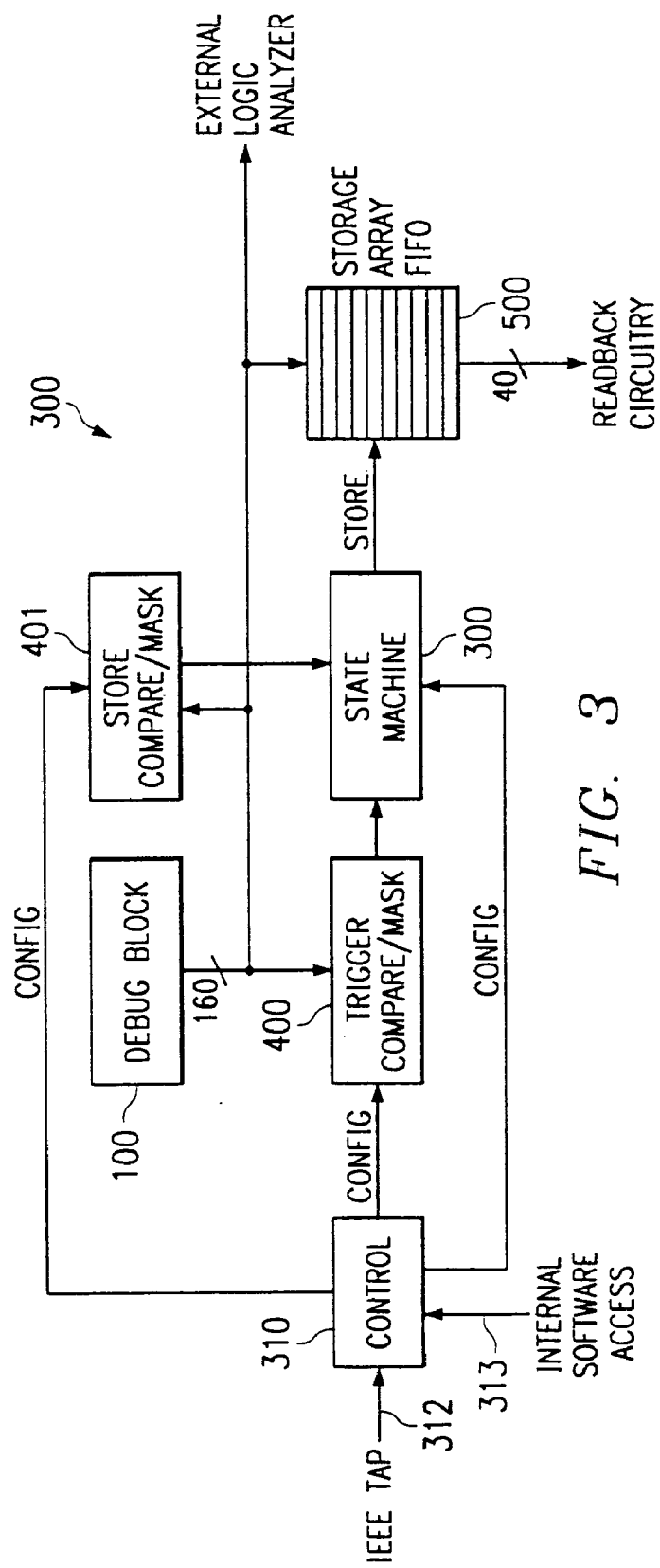
FIG. 3 is a functional block diagram of an embodiment of the invention for collecting data samples from a chip in response to a triggering event.

An overall block diagram of an embodiment of the invention is shown in FIG. 3 A controller 310 receives an IEEE TAP input 312 and internal software access 313 input to setup the data control, programming and other data stored and executed by control system 310. Control system 310 includes conventional control and support circuitry and subsystems such as a programmable microprocessor, associated memory and input/output (I/O). Control system 310 provides configuration outputs to debug block 110, capture state machine 300, trigger compare/mask 400, store compare/mask 401, and to storage array FIFO 500.

Debug block 100 includes the debug bus circuit with distributed multiplexing capabilities as previously described for selectively collecting and combining signal and data samples from various locations on a common chip die. A 160 wide output from the debug block 100 is provided to trigger and store compare/mask and statement machine 400 to trigger data collection and to store array FIFO 500 representing the sampled data. Thus, debug block 100 provides both data to initiate data sampling and collection and the sampled data itself.

State machine 300, trigger compare/mask 400, and store compare/mask 401 provide required logic circuitry under configuration control of control system 310 to initiate data collection by sending an appropriate store command to storage array FIFO 500 upon detection of appropriate trigger and store conditions. Control system 310 also provides configuration control to storage array FIFO 500 to select, buffer and output the contents of the storage array FIFO 500 as will be described more fully below. In addition to providing the sampled signals to state machine 300, trigger compare/mask 400 and store compare/mask 401 and storage array FIFO 500, debug block 100 also provides a continuous output to an external logic analyzer via, for example, dedicated output pins.

Two embodiments of the invention are described herein. In a first embodiment, the invention is embodied and described in terms of a state machine having two logic networks for detecting data, control signals or other events and conditions of a device being tested or monitored to provide respective triggers. A first one of the events, termed a "trigger" event is used to define and initiate a period during which targeted data is to be collected. The targeted data is further defined by a "store" event which looks for and initiates collection of data defined by the second network. The store event results in collecting one or more pieces of data. According to the present embodiment, data continues to be stored until a desired amount of data has been collected. Upon reaching this pre-determined amount of stored data, the collection process is halted and the data is made available for output. This embodiment further provides for pre-triggered data collection to the extent that the desired amount of post trigger data leaves room in the memory to store the extra, pre-trigger samples. Thus, according to at least one feature of this embodiment, a sample memory may be continuously loaded with targeted samples up until a predetermined number of samples past a user definable trigger event have been stored. This provides for an exceedingly flexible arrangement of amounts and timing of data collected.

Figure 4:
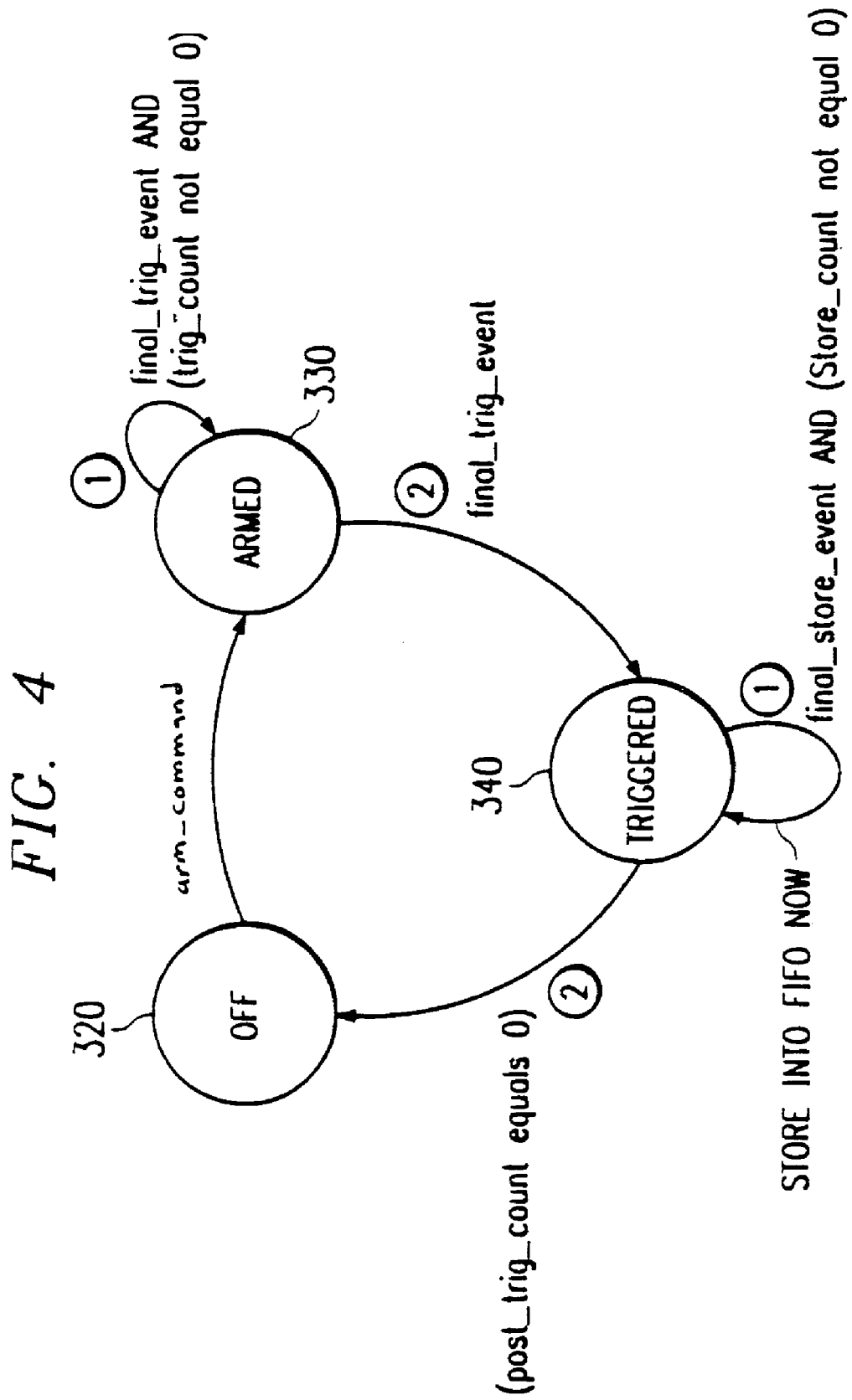
FIG. 4 is a state diagram of an embodiment of the invention.

Referring to FIG. 4 of the drawings, the state machine starts in "OFF" state 320 upon its initialization. In this state, the state machine may output any data samples previously stored and await an "arm_command" command from a controller. Upon receipt of the "arm_command", the state machine transitions to ARMED state 330. While in the ARMED state, the state machine processes the selected sampled data to detect and identify predetermined data patterns and combinations defined by a mask and appropriate combinatorial logic. Of course, the combinatorial logic mask may be implemented either in hardware, firmware or software. The ARMED state is maintained until a predetermined, programmable number of triggering events are detected as indicated by path 1 in FIG. 4. During this time, data satisfying a "store" criteria (and if selected, some number of immediately following data samples) may be stored, although some or all of this data may be lost upon an overflow of the memory such that new data overwrites old data.

Upon occurrence of the desired number of triggers, a signal or other demarcation labeled "final_trig_event" causes a transition of the state machine from the ARMED to the TRIGGERED state 340. If not already enabled in the TRIGGERED state, the state machine causes data samples meeting programmed criteria, and predetermined numbers of samples immediately following such data, to be stored in the memory. This is shown by transition 1 in FIG. 4. The "final_store_event" signal may be implemented such that the triggering data is stored together with the programmable number of subsequent samples while ignoring triggering events during the data capture, or by having the triggering event resetting the amount of trailing data captured so that a predetermined amount of data following the last triggering event is captured as a contiguous group of samples.

According to the present embodiment of the invention, sampling continues until a programmable number of samples have been collected during the TRIGGERED state. This number may be implemented by decrementing a counter which has been prestored with a value representing a number of samples to be captured and stored. As shown in transition 2 exiting the TRIGGERED state 340, upon counter value post_trig_count=0, the TRIGGERED state is exited and the state machine enters the OFF state 320. In this OFF state, the collected and stored data may be output from the memory, processed, or subject to any other requirements including providing the data off chip.

Figure 9:
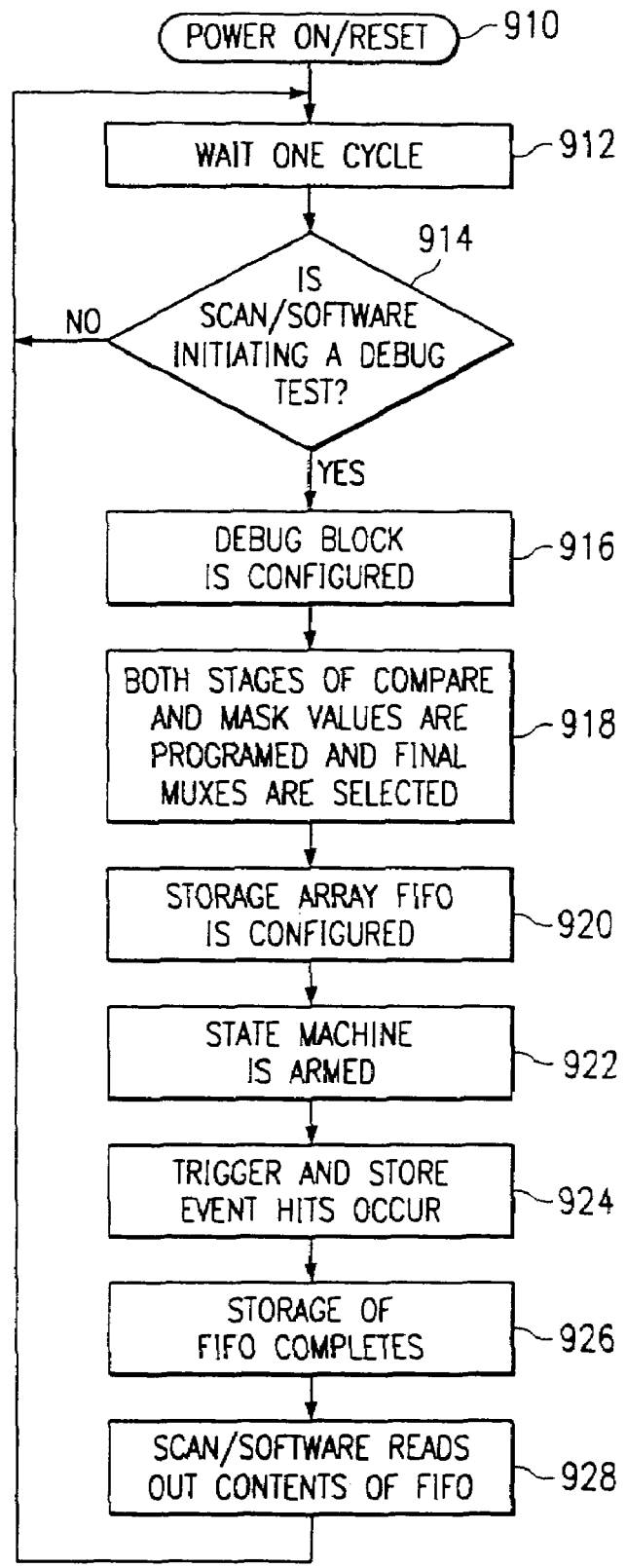
FIG. 9 is a flow diagram of a preferred embodiment of the invention.

An overview of the functioning of the present embodiment of the invention is presented in connection with FIG. 9. Upon power on, the device undergoes a reset so as to initialize the controllers and store any data required into appropriate counters and registers. This may be performed in response to prestored programming, instructions and data present in a memory or may be loaded into the device using, for example, an IEEE TAP interface as discussed in connection with FIG. 3 of the drawings.

After initialization at Step 910, the device waits one cycle at delay 912 and, at decision block 914, enters a wait loop if a debug test has not been initiated. Alternatively, upon detecting test initiation, the device configures its debug block at Step 916 so that appropriate configuration controls and signals are issued to a data collection network to obtain data samples from various locations about a chip. At Step 918, logic is configured including loading and storing of mask values and control of muxes and other logic elements so that trigger and store events may be generated in response to predetermined configurations and combinations of data. At Step 920, the storage array FIFO is configured so as to provide appropriate segments of the sampled data to the memory FIFO for storage. This may include storing data from the full 160 bit wide debug bus or only portions thereof. In addition, the storage array may be configured to include a pseudo clock in the form of a counter value as part of each data sample to be stored as a relative time stamp.

The state machine is armed at Step 922 so that triggering events are counted so as to eventually cause a transition to the TRIGGERED state. Thus, Step 924 represents counting an appropriate number of triggers, and thence, detecting store event hits, each time storing an appropriate number of data samples in the FIFO. At Step 926, the predetermined number of samples to be collected during the TRIGGERED state are obtained such that processing continues at Step 928 to read out the contents of the FIFO. As previously mentioned, other processing may be included as part of or following completion of the data collection as either a feature of the present device or external to a chip when the present invention is incorporated as part of an integrated circuit under test.

Figure 10:
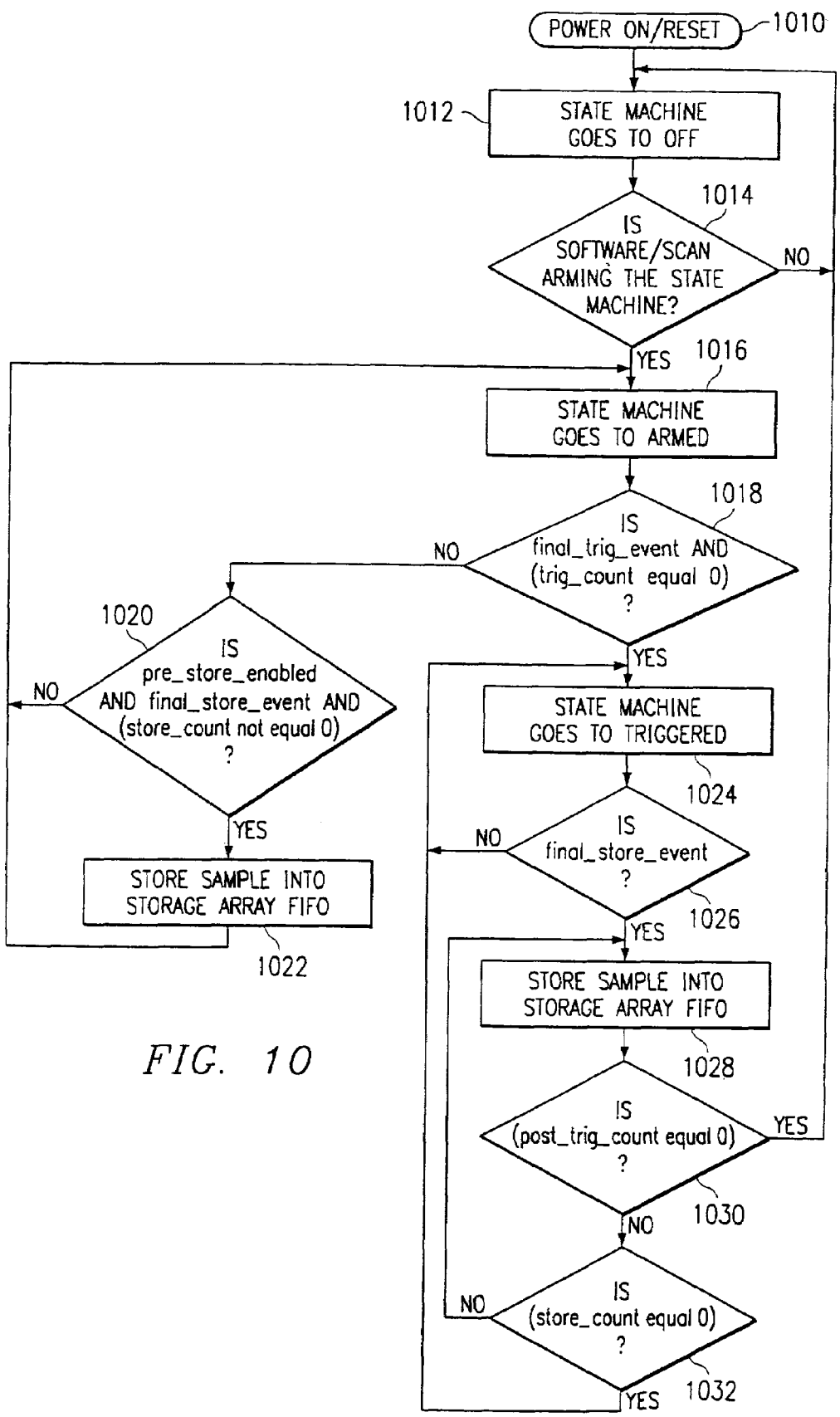
FIG. 10 is a flow diagram detailing states and transitions defining a state machine in accordance with the invention.

FIG. 10 is a logic diagram corresponding to the state diagram of FIG. 4. Thus, at Step 1010, a power on or reset initiates the state machine so that at Step 1012, the state machine goes to OFF. The state machine maintains this condition until the "arm_command" is issued by the control 310 as indicated by exiting decision block 1014 out to the right and continuing to loop through Step 1012.

Upon receiving the "arm_command", flow continues out the bottom of block 1014 wherein, at block 1016 the state machine goes to ARMED. Block 1018 represents the bottom of a first inner loop where the state machine is awaiting detection of a predetermined number of triggers to be detected. Until occurrence of the requisite, preprogrammed number of triggering events, flow continues out the left of decision block 1018 to decision block 1020. Here, a decision is made to either store samples meeting a prestore condition if this feature has been enabled, as represented by block 1022. Where capture of data prior to occurrence of a final triggering event is not desired, flow instead continues out the left of decision block 1020 back to the top of the inner loop defined by block 1016 with the state machine continuing in the ARMED state.

Referring back to decision block 1018, when the predetermined number of data samples satisfying the trigger condition have been detected, flow continues downward to block 1024 where the state machine goes to TRIGGERED. In the TRIGGERED state, the state machine will continue to collect and store data until the programmed number of data samples have been collected and stored as indicated by the "post_trig count" equaling 0 at decision block 1030. Thus, at decision block 1026, a second wait loop is entered until an appropriate store event occurs. Upon detection of the store event, flow continues at block 1028 to store the sample into the storage array FIFO. As previously mentioned, the total number of samples stored are examined at block 1030 to determine if the desired number of data samples have been collected, thereby terminating sampling. If not, then flow continues onto decision block 1032 where a determination is made if any additional samples immediately following the sample initiating the current store cycle are to be collected and stored. Thus, the second counter test is performed at decision block 1032 such that a desired number of post store samples result in continued looping back to block 1028. Conversely, upon storage of any and all desired post store event samples, processing loops back to block 1024 where the state machine continues in the TRIGGERED state.

Figure 11:
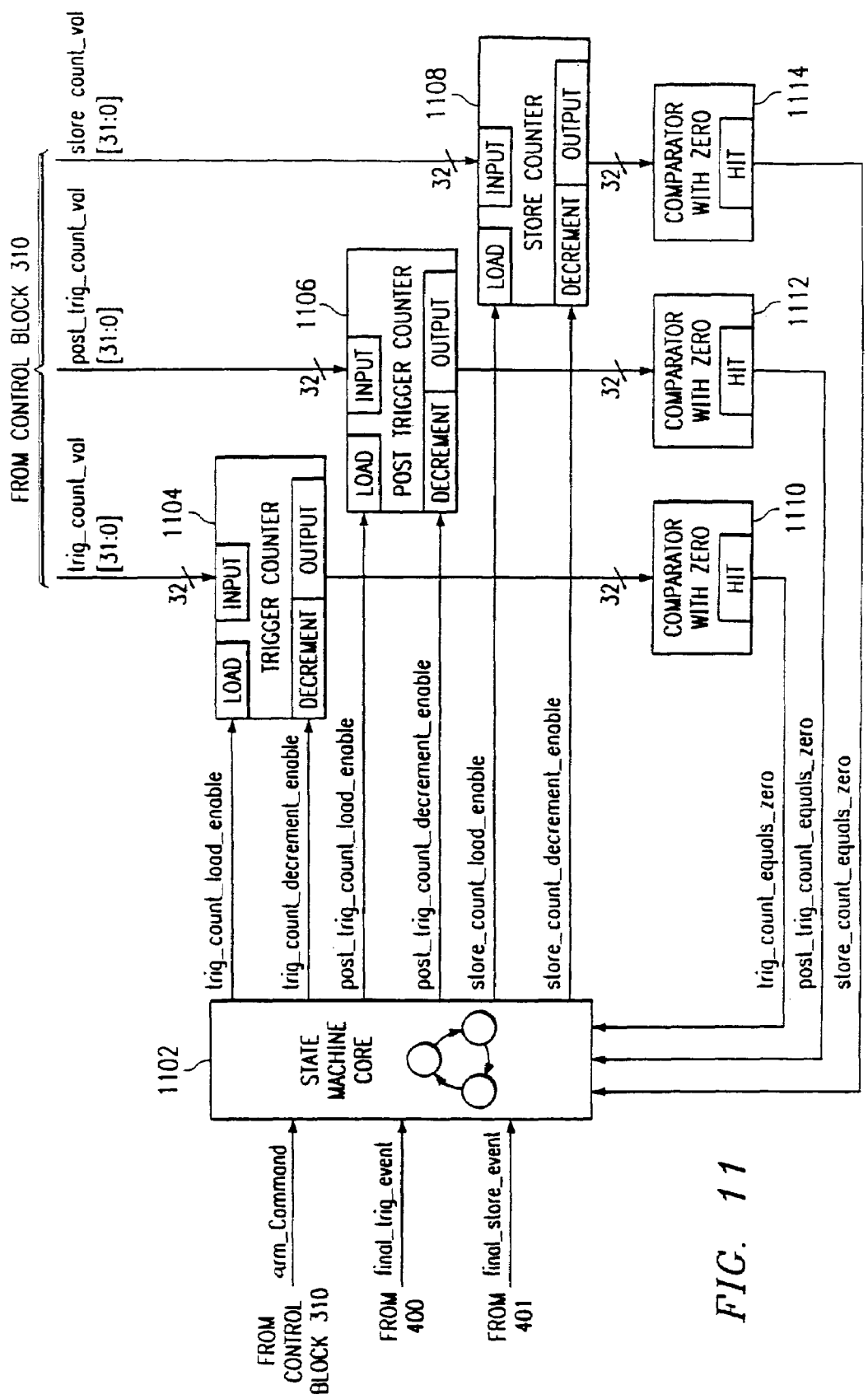
FIG. 11 is a block diagram of a state machine embodiment depicting events and counters defining states and transitions between states.

FIG. 11 is a block diagram detailing the relationship between state machine 1102 and counters 1104, 1106 and 1108 together with their associated comparators 1110, 1112 and 1114. As shown as inputs along the left of state machine core 1102, the state machine is responsive to three events or inputs so as to cause its transition between states. An "arm_command" received from control block 310 causes the state machine to enter the ARMED state from the OFF state as previously described. Further, the "final_trig_event" signal from trigger compare/mask 400 causes the state machine to enter the TRIGGERED state while completion of data sampling is indicated by "final_store_event" corresponding or resulting from appropriate store compare/mask 401 logic.

In response to these signals, state machine core 1102 provides pairs of signals to each of the counters including a "trig_count_load_enable" signal to the trigger counter 1104 to provide initial loading of a value from control block 310, in this case, a 32 bit value "trig_count_val." Similarly, a control signal from state machine 1102 labeled "trig_count_decrement_enable" causes trigger counter 1104 to decrement the current values stored in it, the resultant value being output over a 32 bit line to "Comparator With Zero" 1110. Thus, upon decrementing the value "trig_count_val", stored by block 310 into trigger counter 1104, to 0, "Comparator With Zero" 1110 provides a "hit" output "trig_count_equals_zero" back to state machine core 1102. As previously explained, when the trigger count goes to 0, this indicates that the requested number of data samples satisfying trigger criteria have been detected so as to cause a transition of state machine core 1102 into the TRIGGERED state.

Post trigger counter 1106 is similarly configured to load respective initial data "post_trig_count_val" and decrement that value to 0 as detected by "Comparator With Zero" 1112. As previously described, a 0 result provides "post_trig_count_equals_zero" indicating that the number of data samples requested have been collected and stored.

Finally, store counter 1108 loads under control of state machine core 1102 with values "store_count_val" setting the number of data points in addition to and immediately following the data sampling initiating the store event to also be stored. Thus, any value greater than 0 stored into counter 1108 represents the number of additional data samples immediately following the data sample initiating the store to be included in the group of data to be stored.

Figure 12:
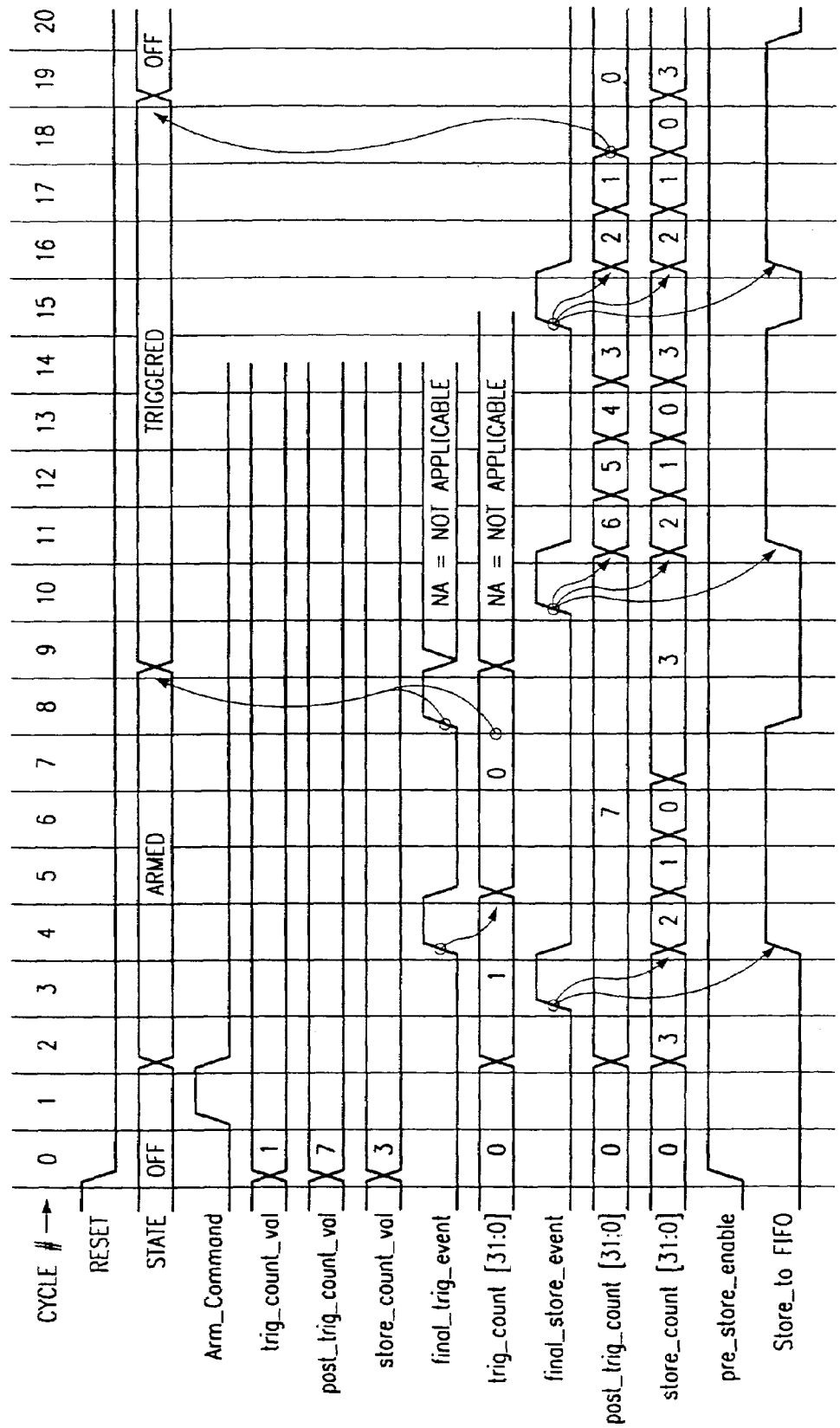
FIG. 12 is a timing diagram of a preferred embodiment of the invention.

A timing diagram according to the present embodiment of the invention is given in FIG. 12. At cycle 0, the reset signal goes low thereby initializing the logic circuitry. Also during this time the "pre_store_enable" line goes high so as to enable the storage of data prior to the trigger event, thereby providing a history leading up to the triggering event. Also, at cycle 0, counter values are loaded including "trig_count_val" equal to 1; "post_trig_count_val" equal to 7 and "store_count_val" equal to 3. Loop control counters are initialized to 0 including "trig_count", "post_trig_count" and "store_count".

During cycle 1, "arm_command" is received resulting in the state machine being armed at cycle 2 and loading the appropriate count values including "trig_count" with the "trig_count_val" value of 1; "post_trig_count" with the "post_trig_count_val" value of 7 and the "store_count" with the "store_count_val" value of 3.

During cycle 3, a first "final_store_event" is received indicating that data is present. Although the prerequisite number of trigger events have not been received, because the "pre_store_enable" signal is high, "Store_to_FIFO" goes high at cycle 4. At the same time, the value in "store_count" starts to be decremented so that the next four data samples are captured and stored as indicated by "Store_to_FIFO" maintaining a high level for four cycles, i.e., cycles 4 through 7 before going low at cycle 8.

At cycle 4, the first "final_trig_event" is received. Because "trig_count_val" equals 1, this first trigger event will be ignored, instead resulting only in the decrementing of the value in "trig_count" at cycle 5. Thus, with this value now at 0, the next "final_trig_event" will result in the state machine being triggered. Thus, at cycle 8, when the second "final_trig_event" is received, the state goes to TRIGGERED the following cycle, i.e., cycle 9. It should be noted that, once triggered, both the occurrence of further "final_trig_event" events and the values stored in "trig_count" are both irrelevant as shown in the timing diagram.

At cycle 10, the first "final_store_event" occurring during the TRIGGERED state is detected resulting in the storage of the next four data samples during cycles 11-14 at which time the "Store_to_FIFO" signal is high in response to "store_count" being decremented from 3 down to 0. At the same time, the value stored in "post_trig_count" is decremented during clock cycles 11-14 from 7 to 3 representing the four data samples stored while in the TRIGGERED state. Similarly, at cycle 15, a second "final_store_event" is generated, again resulting in the storage of four data samples into the FIFO during cycles 16-19. At the same time, the values stored in "post_trig_count" and "store_count" are decremented. However, the storage of these four additional data samples results in "post_trig_count" going to 0 therefore completing the data acquisition and causing the state to go to OFF at cycle 19.

Figure 5:
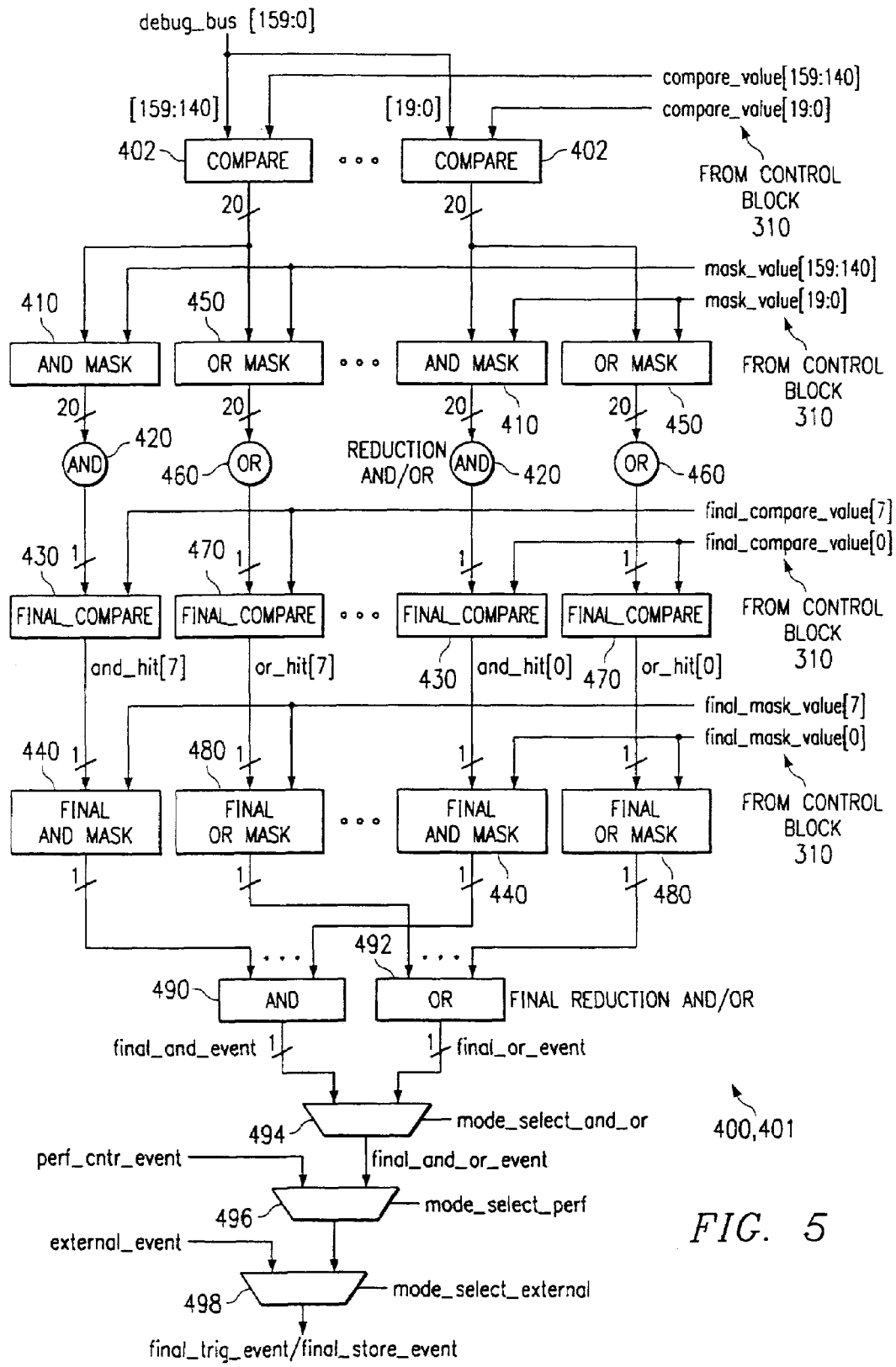
FIG. 5 is a block diagram of a flexible trigger/store circuit for initiating collection of data according to an embodiment of the invention.

The flexible trigger/store circuitry 400/401 is shown in further detail in FIG. 5. The circuitry includes two sets of dual-stage compare/mask structures, one each for the trigger (400) and store (401) condition. According to the present embodiment, the 160 bit wide data available from the data bus is compared in 20-bit chunks which are each sent through two masks (AND and OR logic) and then collapsed down through reduction-AND and reduction-OR logic to two respective sets of eight single "hit" signals (one per original 20-bit chunks). These are "and_hit[7:0]" and "or_hit[7:0]." These two sets of eight hit signals are then compared/masked, then sent through the respective final reduction-AND and ORs down to a final AND event and OR event hit. Two final multiplexers allow the performance counter to provide the event hit as well as a debug clock halt event (to implement a clock halt solution) from a chip input pin for external control. This set of trigger circuitry is duplicated for the store event. All this logic is controlled through software and scan-controllable mode/compare/mask bits.

Referring to FIG. 5, 20 bit segments of sampled data are provided to comparator 402, an output of which is provided in parallel to AND mask 410 and OR mask 450. An output of AND mask 410 is provided to reduction-AND/OR circuitry 420 which, in turn, provides a one bit output FINAL_COMPARE 430. Output 430 is then provided to final AND mask 440 and output of which is anded at AND circuitry 490 together with the seven outputs of the remaining AND stages.

Similarly, comparator 402 provides a 20 bit chunk of the sampled data to OR mask 450 which logically combines the 20 bits of sampled data with the pre-stored mask to provide a 20 bit output to reduction-OR circuit 460. A single bit wide output from reduction-OR circuit 460 is provided as FINAL_ COMPARE 470 to a final OR mask 480. An output from final OR mask 480 is provided to final reduction-OR circuitry 492.

Respective outputs from final reduction-AND circuitry 490 and final reduction-OR circuitry 492 are selected at multiplexer 494 in response to select signal "mode_select_and_or" to provide an output "final_and_or_event". This latter signal is provided in the alternative with a "perf_cntr_event" performance counter event signal by multiplexer 496 in response to a control signal "mode_select_perf" to enable the performance counter module to cause a trigger or store event. The resultant output is provided to multiplexer 498 which selectively provides either the output of multiplexer 496 or a "external_event" signal (from an input pin for external control) as a "final_event" for each of circuits 400 (i.e. trigger) and 401 (i.e. store) respectfully. An example of the functioning of flexible trigger/store circuitry 400/401 assumes a requirement to trigger on a particular address on the debug bus, then capture all data on the bus on cycles when a state machine is NOT in "idle_state". Initially, the debug port will be configured to feed both the address and state machine bits to the debug bus [159:0] using the flexible distributed multiplexer/pipe-stage device. Next, the trigger event mask will be configured to pick off the appropriate bits and a trigger compare value would be programmed to perform a match on the requested address.

Next, the 20-bit chunks of store compare/mask would be programmed to identify the "idle_state" state by setting a compare of "idle_state" and masking out all other bits. The logic circuitry then automatically generates reduction-AND and reduction-OR versions of the result. In the present case, the reduction-AND is required because all the state bits associated with the state machine in question must match to identify the desired condition. The FINAL_STORE_COMPARE and "final_store_mask" bits are then set to identify the reduction-AND bit in question not going high out of the right reduction-AND bits generated by each of the 20-bit chunks from the original debug bus. By checking for the reduction-AND bit not going high, this has an equivalent effect to obtaining a trigger based on the state machine NOT being in the "idle_state" state. The last mode bits also are set to feed the signal out to the final store event.

As previously described, the final element of the trigger/store circuit 400 is an on-chip capture state machine 300 as described in connection with FIG. 4. This state machine begins in an idle condition labeled OFF in the figure and is then able to be armed. The logic circuitry then waits until one or more triggers are observed in the trigger compare/mask network 400, while pre-storing into the storage array FIFO based on the store compare/mask network 401 as well as any pretrigger store condition/mode set in the configuration. Once the trigger (or trigger count) has occurred, the state machine moves to the TRIGGERED state, and continues storing into the storage array FIFO based on hits in the store compare/mask network 401. The store event also has a small counter which allows multiple cycles to be stored on each store event hit, such as storing X cycles after an "data valid." At some point, the overall post-store percentage is met (tracked by the "post_trig_count" counter) and the state machine halts.

Figure 6:
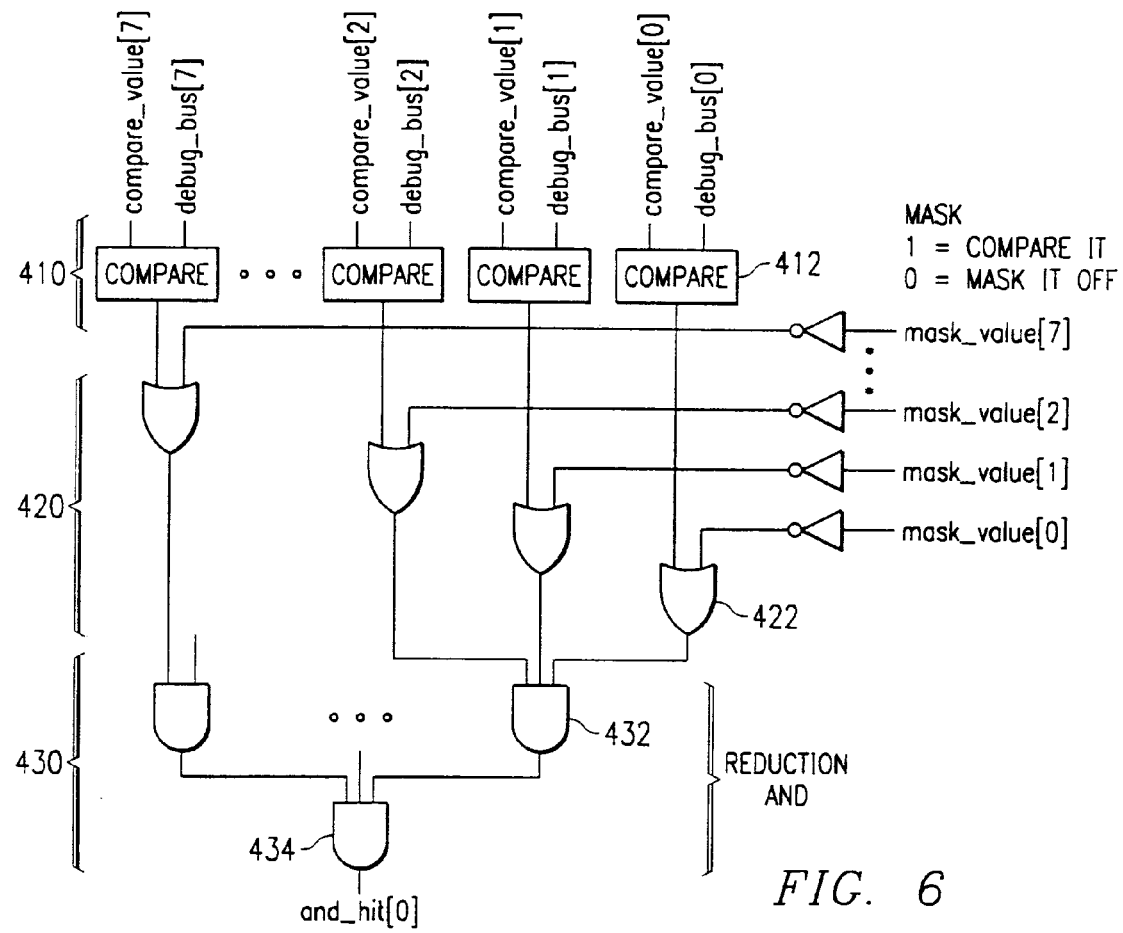
FIG. 6 is a schematic diagram of a trigger/store mask logic circuit implementing an "AND" mask logic.
Figure 7:
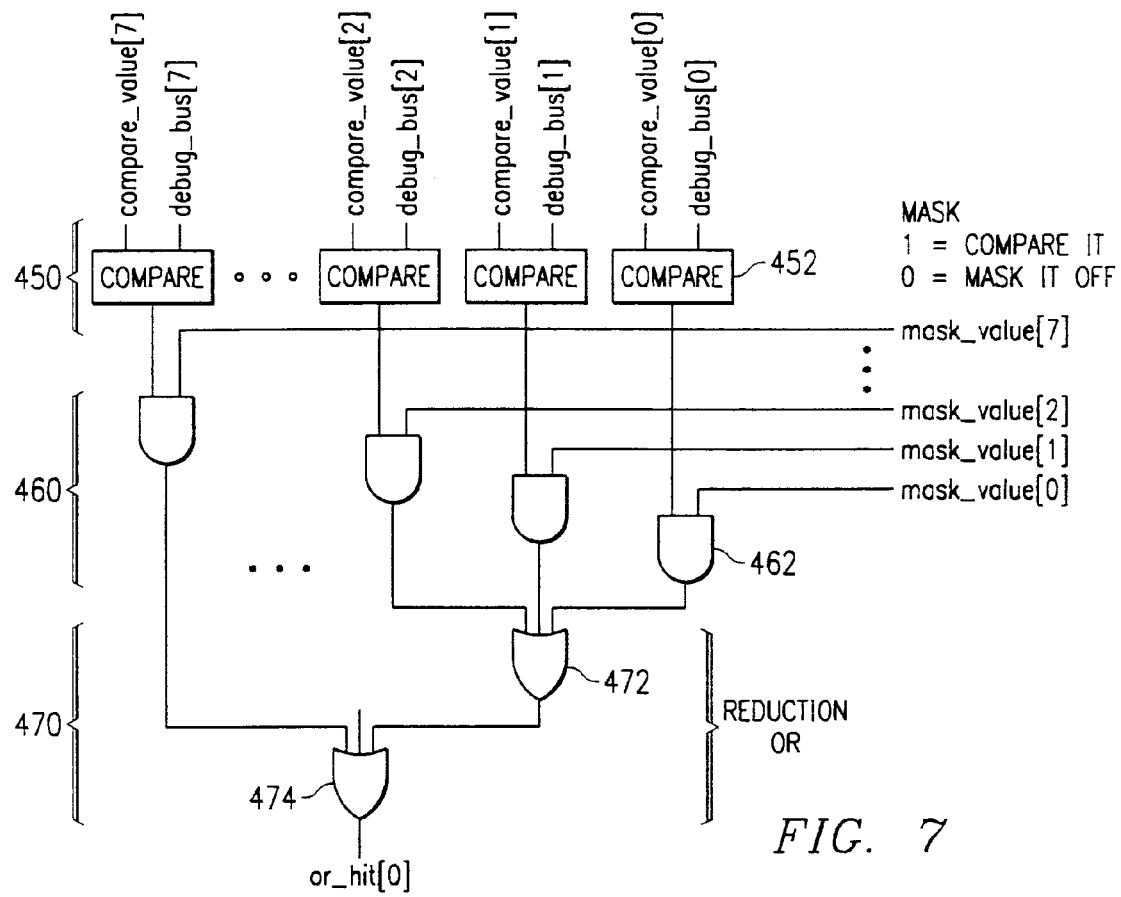
FIG. 7 is a schematic diagram of a trigger/store mask logic circuit implementing an "OR" mask logic.

Structural details of the "AND" and "OR" logic is shown in FIGS. 6 and 7, respectively. Referring to FIG. 6, the debug bus signals and compare value signals are provided as inputs to comparators 412. The output of the comparators 412 are provided as inputs to respective OR gates 422 which receive respective mask control signals mask_value via respective inverters. Outputs from the OR gates are provided to two stages of "reduction-AND" gates 432 and 434 to provide an output signal labeled "and_hit0" as shown in FIG. 5. FIG. 7 shows similar circuitry to produce a final "OR" event signal labeled "or_hit0." As can be seen, the OR logic is implemented by an initial stage of AND gates 462 feeding a "reduction-OR" 470 comprising two stages of "OR" gates to provide the "or_hit0" on output signal as shown in FIG. 5 of the drawings.

Figure 8:
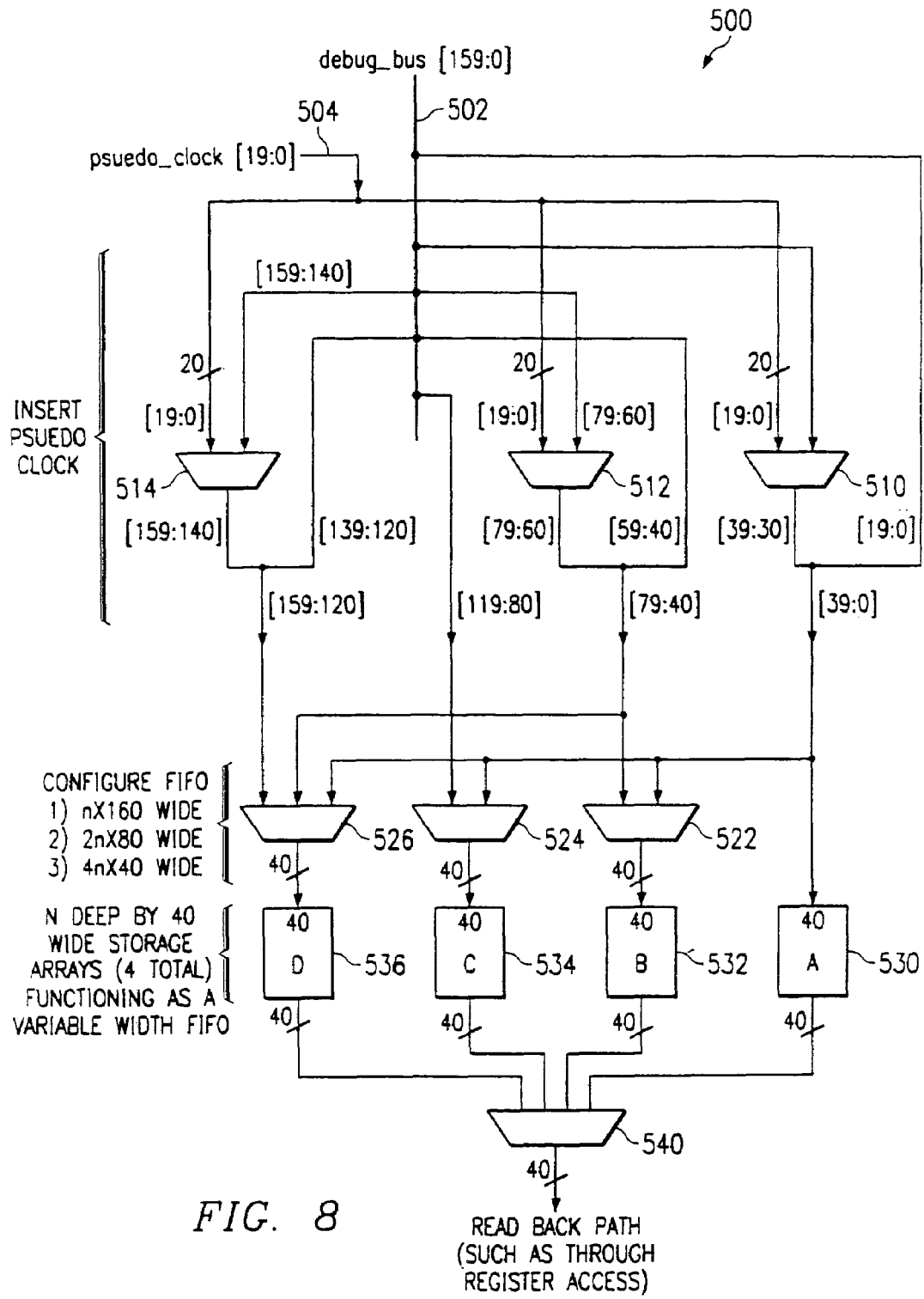
FIG. 8 is a schematic diagram of an on-chip storage array for collecting one or more samples of data and providing one of four data samples as a contiguous output.

The final component is storage array FIFO 500 which provides on (or off-chip) storage and is detailed in FIG. 8 of the drawings. This device can either be a dedicated piece of circuitry for debug use only, or a normal piece of circuitry used in a debug mode, such as a part of a cache or FIFO deallocated from normal use. According to a preferred embodiment of the invention as detailed herein, the on chip solution is implemented as a configurable FIFO. This FIFO is used to store multiple cycles of chip state coming from the debug portion based on the trigger/store circuitry. An added flexibility of this FIFO is that it can be configured to trade off width of data versus number of cycles to capture. For example, since the debug bus described is 160 bits wide, a corresponding implementation of the FIFO might include four 40-bit storage arrays of whatever depth is available on or off the chip. This configuration project determines how many of the 40-bit entries should be loaded each cycle, loading the appropriate portions of the debug bus into the FIFO. The control logic then provides for read out of the FIFO as one logical FIFO 40-bits wide, using an auto-increment read register to speed up accesses. This read out can be larger or smaller than the preferred embodiment including over 160 bits wide debug bus width. Another advantage of the FIFO design is that it can easily be squeezed into less desirable real estate on the chip, as the distributed mux/pipe-stage debug bus scheme can easily be routed over to any location on the chip.

Another advantage of the FIFO is inclusion of a pseudo-clock that may be inserted into the upper portion of the debug bus going into the FIFO. This pseudo-clock is a free running counter to provide a relative tag on the information stored in the FIFO. This is desirable since the store event circuitry may capture data over the course of many non-contiguous machine cycles. Without the pseudo-clock, it would be difficult to determine when data was loaded into the FIFO, which is often necessary to debug a problem.

Referring to FIG. 8, input 502 comprising the 160 bit wide output from the debug bus is provided to two stages of multiplexers including a first stage comprising multiplexer 510, 512 and 514 and a second stage comprising multiplexers 522, 524 and 526. The output from the final stage of multiplexers are provided to 40 bit wide by n deep storage arrays 530, 532, 534 and 536. FIFO 530 selectively receives as an input the least significant 40 bits of data on the debug bus or, in response to the appropriate signal applied to multiplexer 510, the least significant 20 bits of data on the debug bus in combination with the pseudo clock signal occupying the next most significant 20 bits of the 40 bit chunk. Similarly, multiplexers 512 and 514 provide for insertion of the pseudo_clock data as the most significant 20 bits of the corresponding 40 bit chunks output by those multiplexers. Multiplexers 522, 524 and 526 provide for various configurations of the data supplied via selector 540 to accommodate, for example, a plurality of n by 160 bit wide outputs, 2n by 80 bit wide outputs, or 4 n by 40 bit wide output samples.

As described herein, the debug bus, trigger/store circuit and storage array provide for sampling multiple cycles of debug information on the chip without allocating pins for use with a logic analyzer. Because this debug solution is entirely accessible through software or scan, it is easier to use in all system configurations independent of the test apparatus, thereby enabling faster debug of the chip.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein maybe utilized according to the present invention. Accordingly, the appended claims are intended to include within their scope such processes, machines, manufacture, compositions of matter, means, methods, or steps.

What is claimed is:

1. Circuitry for providing external access to signals that are internal to an integrated circuit, said circuitry comprising:
   a network comprising a plurality of multiplexers physically distributed throughout the integrated circuit, each of said multiplexers having its inputs coupled to a nearby set of nodes within the integrated circuit;
   a trigger event generator receiving a first N bits of sampled data from said network, said trigger event generator including a definable mask and selectively performing a boolean operation on said sampled data based on said mask to provide a trigger event; and
   a sampling circuit responsive to said trigger event to identify target data, wherein said sampling circuit includes switching circuitry configured to selectively provide a predetermined portion of said target data, wherein said predetermined portion of said target data is N/M bits wide where N/M is a positive integer.

2. The circuitry according to claim 1 wherein said sampling circuit includes multiplexing circuitry configured to combine M of said portions of said target data into a data unit N bits wide.

3. Circuitry for providing external access to signals that are internal to an integrated circuit, said circuitry comprising:
   a network comprising a plurality of multiplexers physically distributed throughout the integrated circuit, each of said multiplexers having its inputs coupled to a nearby set of nodes within the integrated circuit;
   a trigger event generator receiving a first N bits of sampled data from said network, said trigger event generator including a definable mask and selectively performing a boolean operation on said sampled data based on said mask to provide a trigger event; and
   a sampling circuit responsive to said trigger event to identify target data, wherein said sampling circuit includes a FIFO storage array, and wherein said FIFO storage array is N/M bits wide where N/M is a positive integer.

* * * * *

UNITED STATES PATENT AND TRADEMARK OFFICE
CERTIFICATE OF CORRECTION

PATENT NO.        : 7,325,164 B2                                  Page 1 of 1
APPLICATION NO. : 10/670620
DATED             : January 29, 2008
INVENTOR(S)       : Jeffrey C. Swanson et al.

It is certified that error appears in the above-identified patent and that said Letters Patent is hereby corrected as shown below:

In column 3, line 20, delete "took" and insert -- look --, therefor.

Signed and Sealed this

Second Day of September, 2008

JON W. DUDAS
*Director of the United States Patent and Trademark Office*